United States Patent [19]
Tung

[11] Patent Number: 6,110,803
[45] Date of Patent: Aug. 29, 2000

[54] METHOD FOR FABRICATING A HIGH-BIAS DEVICE

[75] Inventor: Ming-Tsung Tung, Hsinchu Hsien, Taiwan

[73] Assignee: United Microelectronics Corp., Taiwan

[21] Appl. No.: 09/209,736

[22] Filed: Dec. 10, 1998

[51] Int. Cl.⁷ .................................................. H01L 21/76
[52] U.S. Cl. ...................... 438/442; 438/297; 438/226; 257/519
[58] Field of Search ..................................... 438/442, 452, 438/297, 298, 362, 363, 372, 226, 231, 232; 257/519

[56] References Cited

U.S. PATENT DOCUMENTS

| | | | |
|---|---|---|---|
| 4,700,454 | 10/1987 | Baerg et al. | 438/297 |
| 5,256,563 | 10/1993 | Mosiehi et al. | 438/297 |
| 5,358,890 | 10/1994 | Sivan et al. | 438/297 |
| 5,372,951 | 12/1994 | Anjum et al. | 438/452 |
| 5,393,677 | 2/1995 | Lien et al. | 438/297 |
| 5,451,536 | 9/1995 | Redwine | 257/519 |
| 5,525,535 | 6/1996 | Hong | 438/442 |
| 5,554,543 | 9/1996 | Yang | 438/442 |
| 5,556,798 | 9/1996 | Hong | 438/442 |
| 5,770,880 | 6/1998 | Woodbury et al. | 438/298 |
| 5,885,876 | 3/1999 | Dennen | 438/294 |
| 5,913,122 | 1/1999 | Lee et al. | 438/297 |
| 6,025,237 | 2/2000 | Choi | 438/301 |

*Primary Examiner*—Chandra Chaudhari
*Assistant Examiner*—David S Blum
*Attorney, Agent, or Firm*—Blakely Sokoloff Taylor & Zafman

[57] ABSTRACT

A method for fabricating a high-bias device is provided. The method contains forming an N-type epitaxial silicon layer over a P-type substrate. At least a first stacked double well is formed in the epitaxial silicon layer at a region, where a field oxide (FOX) structure is to be formed. A second stacked double well is formed in the epitaxial silicon layer at a region, where a source region is to be formed inside. A FOX structure is formed on the first stacked double well. A gate oxide layer is formed on the epitaxial silicon layer. A conductive gate layer is formed over the substrate to cover a region extending from a portion of the FOX structure to a portion of the second stacked double well. A source region is formed in the second stacked double well with the second-type dopant. A drain region is formed in the epitaxial silicon layer at the opposite side of the FOX layer.

13 Claims, 4 Drawing Sheets

METHOD FOR FABRICATING A HIGH-BIAS DEVICE

BACKGROUND OF THE INVENTION

1. Field of the Invention

This invention relates to semiconductor fabrication, and more particularly to a method for fabricating a high-bias device.

2. Description of Related Art

As the size of semiconductor device is reduced, the channel length is accordingly reduced, resulting in a semiconductor device with a faster operational speed. However, even though the shorter channel length raises the operational speed, a channel length that is too short creates other serious problems. These problems are generally called the short channel effect and are described as follows. If the bias applied on the semiconductor device is kept constant but the channel length is shortened, according to a formula of "electric field (E-field)=bias/channel length", where E-field is measured in units of "V/m", the electrons within the channel gain more energy due to the stronger E-field so that the possibility of an electrical breakdown is higher.

In conventional methodology, a high bias MOS device usually employs an isolation layer and a drift region under the isolation layer to increase the distance between the source/drain regions and the gate. This allows the MOS device to work normally, even when a high bias is applied.

FIG. 1 is a cross-sectional view of a portion of a substrate, schematically illustrating a conventional structure of a high-bias device. In FIG. 1, a P-type semiconductor substrate 100 includes a field oxide (FOX) layer 102, an N-type source region 104, an N-type drain region 106, and a gate 110 on a gate oxide layer 101. The FOX layer 102 can increase the distance between the source region 104 and the drain region 106 so as to reduce the electric field in a channel region between them. In the substrate 100, an N-type doped region 108 is also included below the FOX layer 102 and a portion of the gate 110 to serve as a drift region of carriers. A P-type lightly doped region 112 below the source region 104 and a portion of the gate 110 is formed in the substrate 100 so as to increase an internal electric field at the channel region abound the source region 104. This can increase transconductance $g_m$ of the device to have a better operation speed.

In this conventional structure of the high-bias device, when it is operated at high bias input, a region around an end point 114 of the channel region close the drift region 108 has a stronger electric field due to its larger structure surface curvature. A potential crowding may occur. Since a created depletion region in the drift region 108 cannot endure this high electric field, an electric breakdown may occur on the channel region. A typical solution to solve this issue of electric breakdown is reducing the dopant concentration in the drift region 108. The depth of the depletion region therefore is increased so as to increase the electric breakdown voltage. However, since the dopant concentration of the drift region 108 is reduced, the current driving performance of the high-bias device is also reduced.

SUMMARY OF THE INVENTION

It is therefore an objective of the present invention to provide a method for fabricating a high-bias device so as to reduce an electric field on the channel region close to a drain depletion region. The electric breakdown voltage is increased so that the high-bias device has a better high-bias tolerance.

It is another an objective of the present invention to provide a method for fabricating a high-bias device so as to increase the current driving performance of the high-bias device.

In accordance with the foregoing and other objectives of the present invention, a method for fabricating a high-bias device is provided. The method includes forming an epitaxial silicon layer, which is also a single crystal cell silicon layer, over a substrate. The substrate is doped with a fist-type dopant, and the epitaxial silicon layer is doped with a second-type dopant, which is opposite to the first-type dopant. At least a first stacked double well is formed in the epitaxial silicon layer at a region, where an isolation structure, such as a field oxide (FOX) structure, is to be formed. Several the first stacked double wells preferably are formed. A second stacked double well is formed in the epitaxial silicon layer at a region, where a source region is to be formed inside. Both the first and the second stacked double wells are doped with the first-type dopant. A FOX structure is formed on the first stacked double well. A gate oxide layer is formed on the epitaxial silicon layer. A conductive gate layer is formed over the substrate to cover a region extending from a portion of the FOX structure to a portion of the second stacked double well. A source region is formed in the second stacked double well with the second-type dopant. A drain region is formed in the epitaxial silicon layer at the opposite side of the FOX layer.

In the foregoing, the high-bias device has a structure including the epitaxial silicon layer with the second-type dopant on the first-type substrate. The FOX structure is formed on the epitaxial silicon layer. There is at least one stacked double well with first-type dopant below the GOX structure. A drain region is located at a first side of the FOX layer in the epitaxial silicon layer, and a gate oxide layer and a conductive gate are located at a second side of the FOX, opposite to the first side. The gate oxide layer is on the substrate, and the gate is on the gate oxide later and on a portion of the FOX structure. The side of the gate structure on the FOX structure is a first side of the gate. The other side of the gate is a second side of the gate. A second stacked double well with the first-type dopant is located in the epitaxial silicon layer, and has an overlapping portion with the first side of the gate. A source region is located in the second well beside the first side of the gate.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 2A–2F are cross-sectional views of a portion of a substrate, schematically illustrating a fabrication process for forming a high-bias device, according to a preferred embodiment of the invention.

Figure 1:
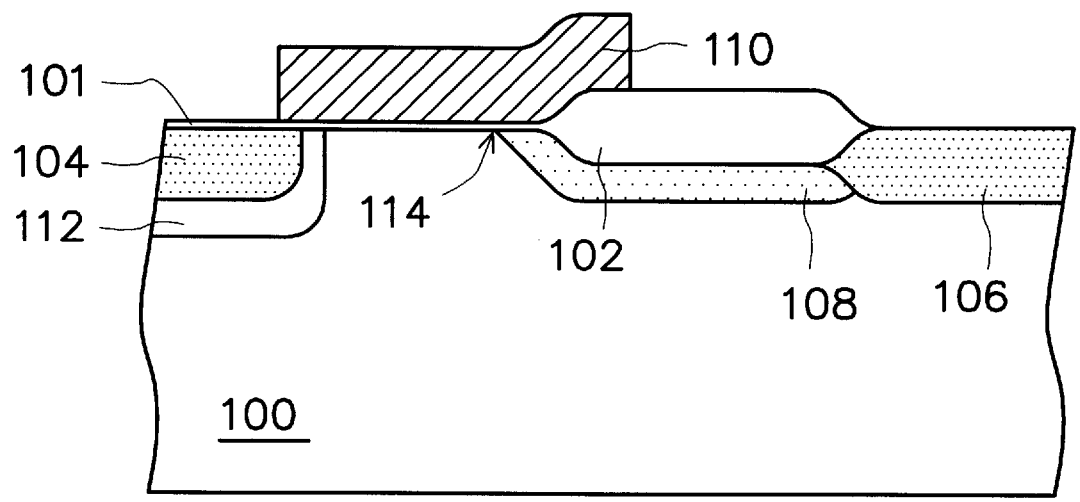
FIG. 1 is a cross-sectional view of a portion of a substrate, schematically illustrating a conventional structure of a high-bias device.
Figure 2A:
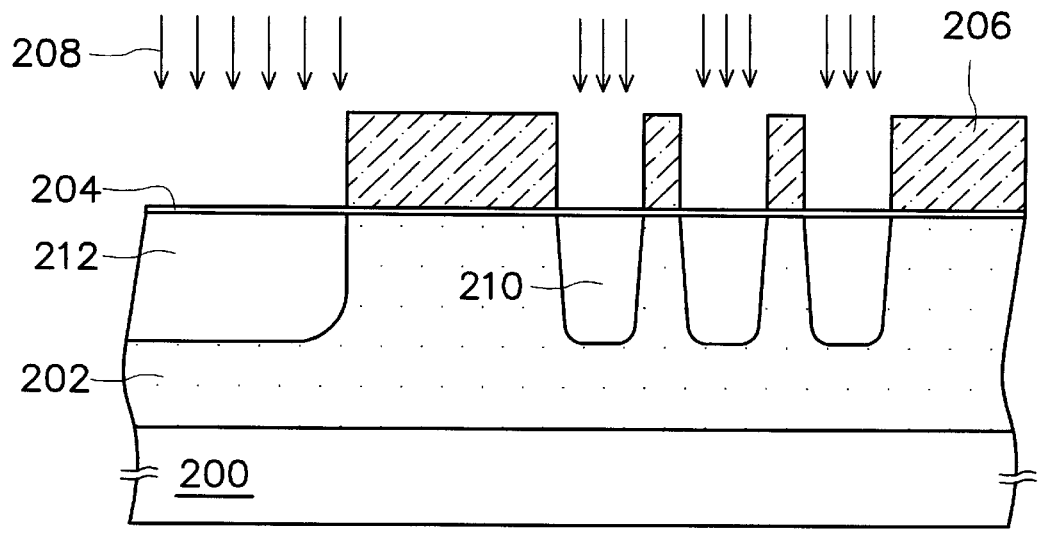
FIGS. 2A–2F are cross-sectional views of a portion of a substrate, schematically illustrating a fabrication process for forming a high-bias device, according to a preferred embodiment of the invention.

In FIG. 2A, an epitaxial silicon layer 202 with a second-type dopant is formed on a semiconductor substrate 200 with a first-type dopant. The first-type dopant has an opposite conducting property to the second-type dopant. If the first-type dopant is a P-type dopant then the second-type dopant is an N-type dopant, and if the first-type dopant is an N-type dopant then the second-type dopant is a P-type dopant. In the following example, the first-type dopant is, for example, represented by the P-type dopant, and the second-type dopant is, for example, represented by the N-type dopant. The substrate 200, for example, is P-type, and the epitaxial silicon layer is N-type.

The epitaxial silicon layer 202 is formed by, for example, low pressure (LP) chemical vapor deposition (CVD), or called LPCVD, with a reaction gas of $SiH_4$ at a temperature about greater than 700° C. An oxide layer 204 is formed by, for example, thermal oxidation or CVD on the epitaxial silicon layer 202 to protect the epitaxial silicon layer 202. At least one P-type well 210 is formed in the epitaxial silicon layer 202. There are three P-type wells 210, for example, shown in FIG. 2A. A P-type well 212 is also formed in the epitaxial silicon layer 202. A typical process to form the P-type wells 210, 212 is, for example, forming a patterned mask layer 206 on the epitaxial silicon layer 202. The mask layer 206 preferably includes photoresist. Using the patterned mask layer 206 as an implantation mask, an ion implantation process 208 is performed to implant ions, such as $B^{2+}$, $BF_2^+$, or Indium ions into the epitaxial silicon layer 202 to form the P-type wells 210, 212. A thermal process is also, for example, performed to drive-in the implanted ions into the epitaxial silicon layer 202. The dopant concentration of the epitaxial silicon layer 202 is about $8 \times 10^{15}$ $1/cm^3$–$8 \times 10^{16}$ $1/cm^3$.

Figure 2B:
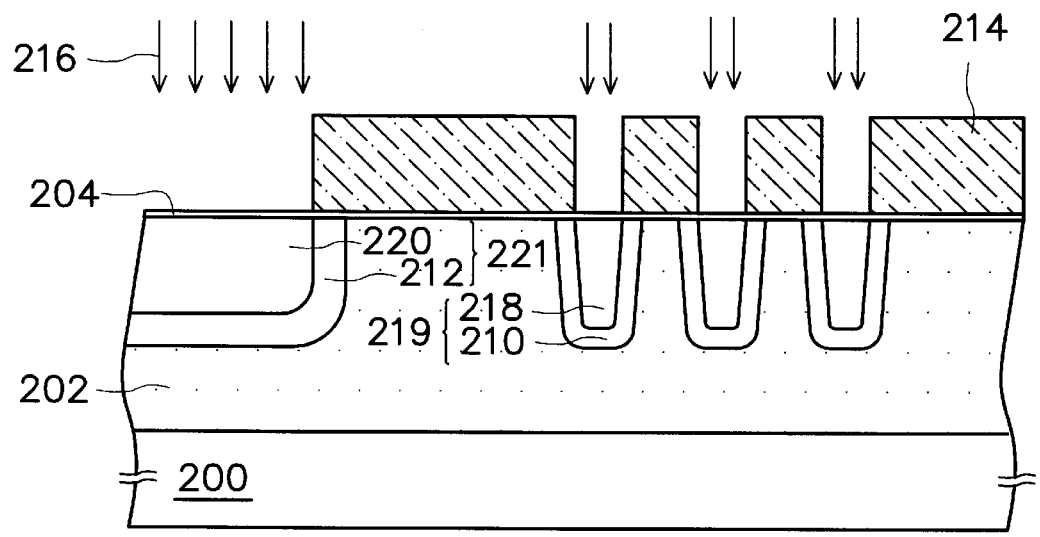

In FIG. 2B, after implantation, the patterned mask layer 206 is removed. A patterned mask layer 214 similar to the patterned mask layer 206 of FIG. 2A but having larger pattern size is formed. Using the patterned masked layer 214 as a mask, an ion implantation process 216 is performed to implant P-type ions, such as $B^{2+}$, $BF2^+$, or Indium ions, onto the epitaxial silicon layer 202 within the wells 210, 212 so that a well 218 and a well 220 are respectively formed in the well 210 and the well 212. The well 218 and the well 210 form together as a stacked double well 219, and the well 220 and the well 212 form together as a stacked double well 221. The dopant concentration of the wells, 218, 220 is greater than that of the wells 210, 212, and is about $8 \times 10^{16}$ $1/cm^3$–$8 \times 10^{17}$ $1/cm^3$.

Figure 2C:
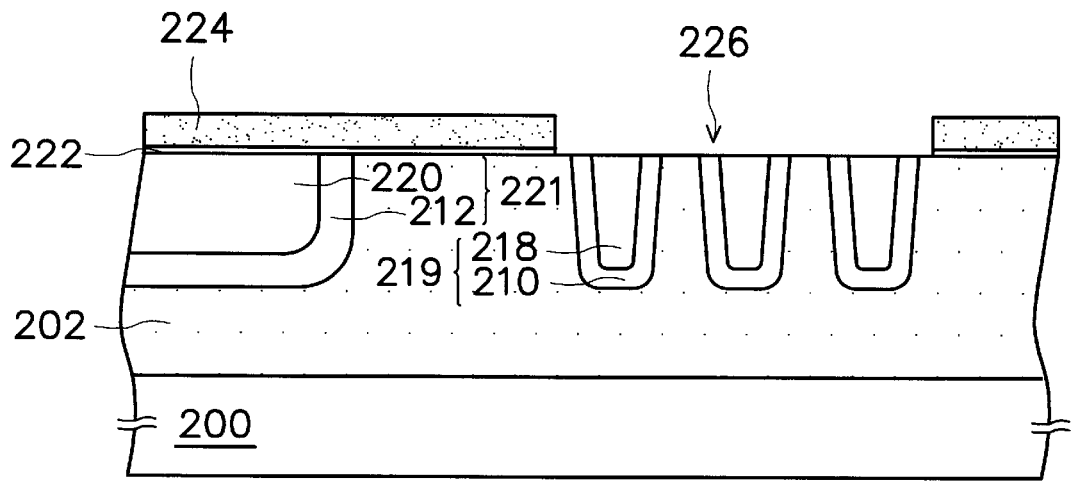

In FIG. 2C, after implantation, the mask layer 214 and the oxide layer 204 are removed by, for example, wet etching. A pad oxide layer 222 and a hard layer, such as silicon nitride layer 224, are sequentially formed over the epitaxial silicon layer 202. A portion of the epitaxial silicon layer 202 at the stacked double well 219 is removed by patterning the silicon nitride layer 224 and the pad oxide layer 222 so that the stacked double well 219 is exposed. The patterning process includes, for example, photolithography and etching to form an opening 226 to expose a region about the stacked double well 219. The formation of the pad oxide layer 222 includes a thermal oxidation process. The formation of the silicon nitride layer 224 includes CVD.

Figure 2D:
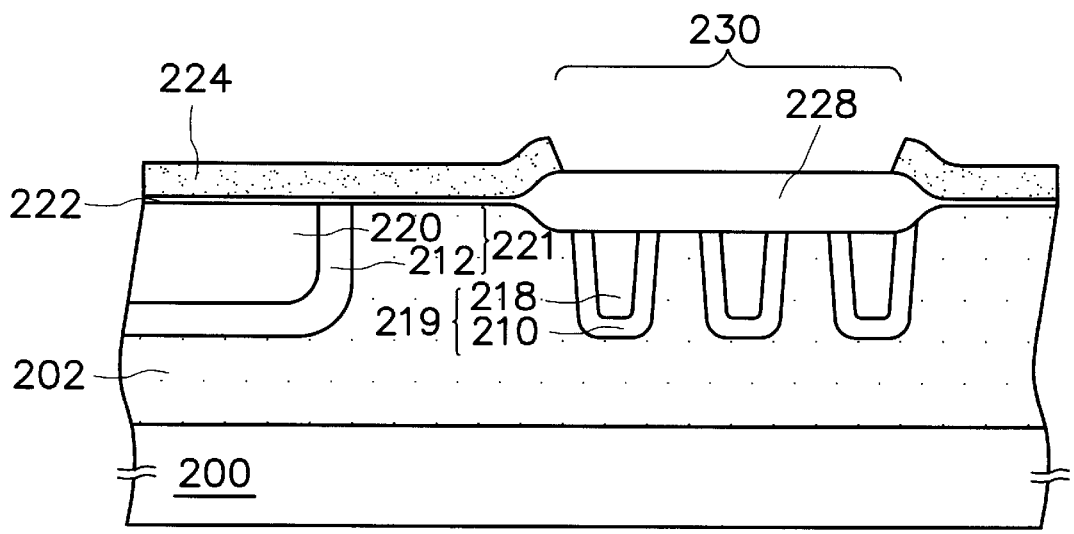

In FIG. 2D, a thermal oxidation process, such as a local oxidation (LOCOS) process, is performed to form a field oxide (FOX) layer 228 on the epitaxial silicon layer 202 at the stacked double well 219.

Figure 2E:
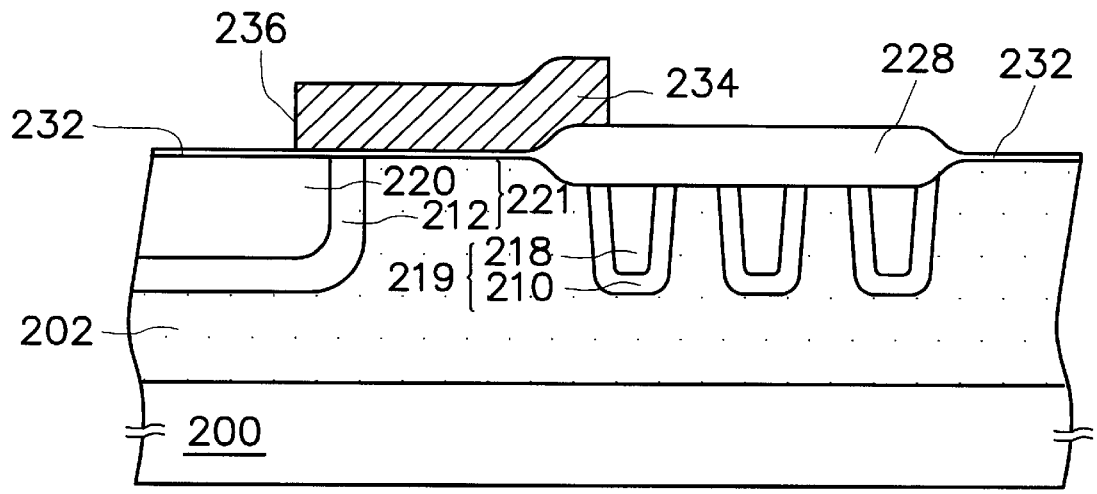

In FIG. 2E, the silicon nitride layer 224 and the pad oxide layer 222 of FIG. 2D are removed by wet etching respectively with hot phosphoric acid and with HF acid so that a portion of the epitaxial silicon layer 202 other than the FOX layer 228 is exposed. A gate oxide layer 232 with a thickness of about 40 Å–1000 Å is formed on the exposed portion of the epitaxial silicon layer 202. A conductive gate layer 234 with a thickness of about 1000 Å3000 Å is formed over the substrate 200 to cover a region extending from a portion of the FOX layer 228 to a portion of the stacked double well 221. The conductive gate layer 234 serves as a gate of the high-bias device. The formation of the conductive gate layer 234 includes, for example, depositing a conductive layer over the substrate by, for example, CVD. The conductive layer includes, for example, doped polysilicon or polycide, in which doped polysilicon can be obtained by in-situ doping polysilicon during CVD process. Patterning the conductive layer by, for example, photolithography and etching forms the conductive gate layer 234.

Figure 2F:
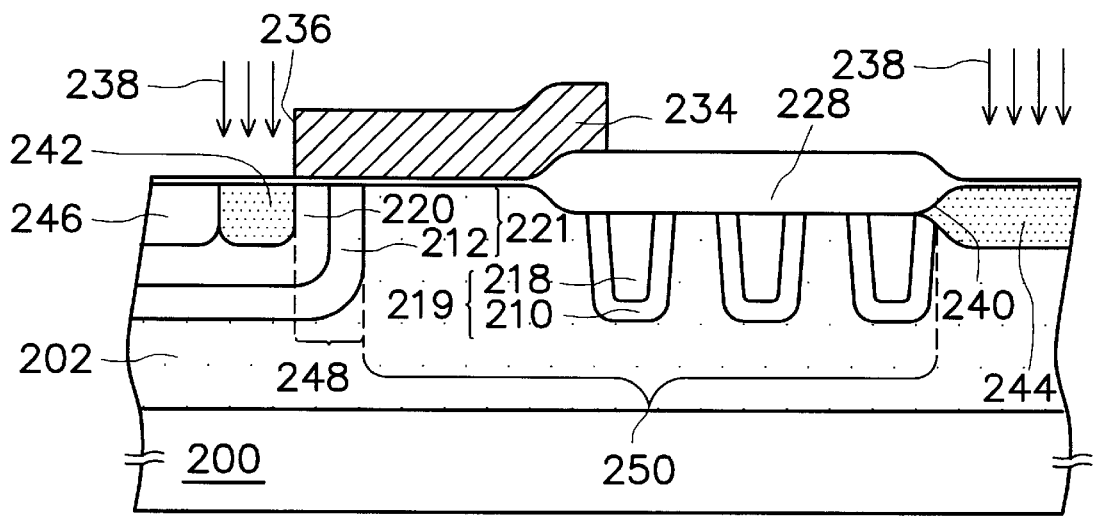

In FIG. 2F, an ion implantation process 238 is performed to implant N-type ions, such as phosphorus, arsenic, or antimony (Sb), onto the epitaxial silicon layer 202 to form a source region 242 and a drain region 244. The concentration of N-type dopants is about $5 \times 10^{19}$ $1/cm^3$–$5 \times 10^{20}$ $1/cm^3$. The drain region 244 is located on one side of the FOX layer 228 against to the conductive gate layer 234. The source region 242 is located along the gate sidewall 236 and is located within the well 220. A P-type doped region 246 abutting the source region 242 is also formed within the well 220. The formation of the P-type doped region 246 includes forming a patterned photoresist layer (not shown) to exposes the well 220 at the desired portion, implanting P-type ions onto the desired portion to form the P-type doped region 246, and removing the photoresist layer. The dopant concentration in the P-type doped region 246 is about $5 \times 10^{19}$ $1/cm^3$–$5 \times 10^{20}$ $1/cm^3$. A high-bias device of metal-oxide semiconductor (MOS) transistor is formed.

In the method of the invention for fabricating a high-bias device, a portion of the well 220 and the well 212 covered by the conductive gate layer 234 forms a channel region 248. Since the dopant concentration of the well 220 is greater than that of the well 212, an internal electric field is increased so as to increase a transconductance $g_m$ of the device. The driving current performance is effectively improved. Moreover, a drift region 250 between the well 212, covered by the conductive gate layer 234, and the drain region 244 is formed. The drift region 250 includes a portion of the epitaxial silicon layer 202 that is lightly doped with N-type ions, and the stacked double well 219 that is lightly doped with P-type ions so that a large depletion region is created when device is applied with operating bias. The large depletion region can reduce the line surface density of electric field lines so that the device can endure the electric induce by the operating high-bias. The electric breakdown voltage is increased.

In conclusion, the invention has several characteristics as follows:

1. The portion of the stacked double well 221 below the conductive gate layer 234 forms a channel region 248, which has greater internal electric field due to a proper dopant concentration distribution at the well 220 and the well 212. The transconductance $g_m$ of the high-bias device is increased so that the current driving performance is improved.

2. The drift region 250 obtains a large depletion region when the devise is operated so that the surface density of the electric field line is reduced. The electric breakdown voltage is increased. The high-bias device has greater capability to tolerate the high-bias input.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a high-bias device, the method comprising:

providing a semiconductor substrate doped with a fist-type dopant;

forming an epitaxial silicon layer on the substrate, wherein the epitaxial silicon layer is doped with a second-type dopant, which is opposite to the first-type dopant;

forming at least one first stacked double well in the epitaxial silicon layer at a first region, and a second stacked double well in the epitaxial silicon layer at a second region, wherein the first stacked double well and the second stacked double well are doped by the first-type dopant;

forming a field oxide (FOX) layer on the epitaxial silicon layer at the first region so that the FOX layer cover the first stacked double well;

forming a gate oxide layer on the epitaxial silicon layer;

forming a conductive gate layer on the gate oxide layer and the FOX layer to cover a range extending from a side portion of the FOX layer to a side portion of the second stacked double well; and forming a drain region abutting an end of the FOX layer opposite to the conductive gate layer, and a source region within the second stacked double well about along a sidewall of the conductive gate layer, wherein the source region and the drain region are doped with the second-type dopant.

2. The method of claim 1, wherein the method further comprises forming an additional doped region abutting the source region within the second stacked double well, wherein the additional doped region is doped with the second-type dopant.

3. The method of claim 1, wherein if the first-type dopant is a P-type dopant then the second-type dopant is an N-type dopant, and if the first-type dopant is an N-type dopant then the second-type dopant is a P-type dopant.

4. The method of claim 1, wherein the first-type dopant is an N-type dopant, and the second-type dopant is a P-type dopant.

5. The method of claim 1, wherein in the step of forming the first stacked double well in the epitaxial silicon layer at the first region, and the second stacked double well in the epitaxial silicon layer at the second region, the step further comprises:

forming at least one first outer well and a second outer well, both of which are doped with the first-type dopant; and forming a first inner well within the first outer well and a second inner well within the second outer well, both of which are doped with the first-type dopant, wherein the first outer well and the first inner well form the first stacked double well, and the second outer well and the second inner well form the second stacked double well.

6. The method of claim 5, wherein the first outer well and the second outer well have less dopant concentration than the first inner well and the second inner well.

7. The method of claim 6, wherein the first inner well and the second inner well comprises a dopant concentration of about $8 \times 10^{16}$ $1/cm^3$–$8 \times 10^{17}$ $1/cm^3$.

8. The method of claim 1, wherein the step of forming the epitaxial silicon layer on the substrate further comprises performing a low pressure chemical vapor deposition (LPCVD) process with a reaction gas of $SiH_4$ at a temperature of about greater than 700° C.

9. The method of claim 1, wherein the epitaxial silicon layer comprises a dopant concentration of about $8 \times 10^{15}$ $1/cm^3$–$8 \times 10^{16}$ $1/cm^3$.

10. The method of claim 1, wherein the source region and the drain region comprises a dopant concentration of about $5 \times 10^{19}$ $1/cm^3$–$5 \times 10^{20}$ $1/cm^3$.

11. A method for fabricating a high-bias device, the method comprising:

providing a semiconductor substrate doped with a fist-type dopant;

forming an epitaxial silicon layer on the substrate, wherein the epitaxial silicon layer is doped with a second-type dopant, which is opposite to the first-type dopant;

forming at least one first well and a second well in the epitaxial silicon layer, in which the first well and the second well are doped with the first-type dopant;

forming a third well in the first well and a fourth well in the second well, in which the third well and the fourth well are doped with the first-type dopant to have greater dopant concentration than the first well and the second well;

forming a field oxide (FOX) layer on the epitaxial silicon layer at the first region so that the FOX layer cover the first well and the third well;

forming a gate oxide layer on the epitaxial silicon layer;

forming a conductive gate layer on the gate oxide layer and the FOX layer to cover a range extending from a side portion of the FOX layer to a side portion of the first well and the fourth well; and forming a drain region abutting an end of the FOX layer opposite to the conductive gate layer, and a source region within the fourth well about along a sidewall of the conductive gate layer, wherein the source region and the drain region are doped with the second-type dopant.

12. The method of claim 11, wherein the method further comprises forming an additional doped region abutting the source region within the fourth well, wherein the additional doped region is doped with the second-type dopant.

13. The method of claim 11, wherein the epitaxial silicon layer comprises a dopant concentration of about $8 \times 10^{15}$ $1/cm^3$–$8 \times 10^{16}$ $1/cm^3$.

* * * * *